(12) United States Patent
Marchman et al.

(10) Patent No.: US 7,961,397 B2
(45) Date of Patent: Jun. 14, 2011

(54) SINGLE-CHANNEL OPTICAL PROCESSING SYSTEM FOR ENERGETIC-BEAM MICROSCOPES

(75) Inventors: Herschel M. Marchman, Dallas, TX (US); Thomas M. Moore, Dallas, TX (US); Rocky Kruger, Dallas, TX (US)

(73) Assignee: Omniprobe, Inc, Dallas, TX (US)

( * ) Notice: Subject to any disclaimer, the term of this patent is extended or adjusted under 35 U.S.C. 154(b) by 473 days.

(21) Appl. No.: 12/201,447

(22) Filed: Aug. 29, 2008

(65) Prior Publication Data

US 2010/0051802 A1    Mar. 4, 2010

(51) Int. Cl.
*G02B 27/10* (2006.01)

(52) U.S. Cl. ........ 359/618; 73/104; 359/352; 250/492.1

(58) Field of Classification Search .......... 250/306, 250/307, 492.1, 492.2; 359/350–353, 355, 359/618, 652–654; 73/104, 105; 385/33, 385/34

See application file for complete search history.

(56) References Cited

U.S. PATENT DOCUMENTS

| | | | |
|---|---|---|---|
| 4,929,041 A | | 5/1990 | Vahala et al. |
| 5,426,302 A | * | 6/1995 | Marchman et al. .......... 850/6 |
| 5,849,371 A | | 12/1998 | Beesley |
| 6,373,070 B1 | | 4/2002 | Rasmussen |
| 6,751,516 B1 | | 6/2004 | Richardson |
| 7,045,791 B2 | | 5/2006 | Benas-Sayag et al. |
| 7,317,515 B2 | | 1/2008 | Buijsse et al. |
| 7,351,966 B1 | | 4/2008 | Marchman et al. |
| 7,446,298 B1 | * | 11/2008 | Stone .......................... 250/216 |
| 7,453,653 B2 | * | 11/2008 | Dowski et al. ................ 359/708 |
| 2006/0177177 A1 | * | 8/2006 | Jenkins et al. ................. 385/33 |
| 2008/0283777 A1 | | 11/2008 | Herschbein et al. |
| 2010/0202042 A1 | * | 8/2010 | Marchman et al. .......... 359/372 |

OTHER PUBLICATIONS

International Searching Authority, International Application No. PCT/US2009/055286, International Search Report and the Written Opinion, Apr. 26, 2010.

* cited by examiner

*Primary Examiner* — Bernard E Souw
(74) *Attorney, Agent, or Firm* — John A. Thomas

(57) ABSTRACT

A single-channel optical processing system for an energetic-beam instrument has separate sources for processing radiation and illumination radiation. The processing radiation and the illumination radiation are combined in a single optical path and directed to a sample surface inside the energetic-beam instrument through a self-focusing rod lens. The self-focusing rod lens thus has a working distance from the sample surface that will not interfere with typical arrangements of ion beams and electron beams in such instruments. A combination of polarizers and beam splitters allows separation of the combined incident radiation and the combined radiation reflected from the sample surface and returned through the same optical channel, so that the reflected radiation may be directed to an optical detector, such as a camera or spectrometer. In other embodiments, additional illumination of the sample surface is provided at an angle to the central axis of the self-focusing rod lens.

40 Claims, 8 Drawing Sheets

US 7,961,397 B2

SINGLE-CHANNEL OPTICAL PROCESSING SYSTEM FOR ENERGETIC-BEAM MICROSCOPES

BACKGROUND

1. Technical Field

This disclosure relates to systems and methods for the inspection, modification and repair of surfaces, samples and microscopic devices in energetic-beam microscopes; in particular, for methods of inspection, modification and repair in focused ion-beam microscopes, scanning electron microscopes and similar instruments.

2. Background Art

Current repair and modification processes for integrated circuit chips (IC's) and for masks generally rely on the formation of local areas of energy dissipation on the surfaces thereof to cause locally confined endothermic reactions. These reactions allow for selective etching or deposition of materials. Focused beams of ions, electrons or photons are used to form these local areas. Focused ion-beam (FIB) tools have thus become dominant in most repair applications, as well as for specimen extraction for failure analysis of IC's.

New materials used in current generation IC's, such as copper and low-k dielectrics, or new materials in photo masks, are not compatible with conventional FIB processes because of damage to dielectrics or scattering of conductive byproducts. Imaging the chip surface with the focused ion beam during navigation to a repair site can also result in damage to the dielectric. Thus, other imaging methods must be used, such as electron beams or laser energy.

Further, typical FIB and SEM chambers have layouts that make it difficult to view the sample being processed, because such chambers generally cannot accommodate an optical microscope for directly viewing the sample. Difficulties with optical microscopes also arise because of the short working distances that may be required to achieve a reasonable numerical aperture (NA), and therefore the difficulty of illuminating the sample by off-axis illumination without shadowing by the objective lens. Also, the conventional optical microscope objective would block one or both of the charged-particle beams in the typical FIB chamber.

There is thus a need for a system and method for conveniently viewing a sample in the vacuum chamber at the same time as processing takes place, and without damaging the sample in viewing and navigation to a repair site. Further, it would be advantageous if a single optical channel could be used for both imaging and processing so as to reduce the size of the instrument in the small chambers of FIB's and SEM's. The use of a single channel for both imaging and processing would not only allow for viewing a process under way, but would also allow optical imaging to be combined with other techniques. An example, not heretofore practical, would be inducing optical fluorescence of nanoparticles in a biological sample with an electron beam, while illuminating the sample with laser light to induce Raman emission in a spectrum of interest.

DRAWINGS

DESCRIPTION

General

In this disclosure, the term "self-focusing rod lens" or "SRL" refers to a gradient-index optical fiber. The SRL has the property that the phase of light passing through it is preserved. The SRL has a radial index gradient, so that the index of refraction is highest in the center of the lens and decreases with radial distance from the axis. In an SRL lens, rays follow sinusoidal paths until reaching the back surface of the lens. Thus, the SRL has the ability to form a real image on the physical surface of the lens. Suitable gradient-index lenses are manufactured by NGS America, Inc. of Somerset, N.J. and sold under the trademark SELFOC. The SRL referred to in this disclosure has the shape of a rod, with first and second ends that transmit light into and out of the optical fiber. The length of the rod should be selected to allow sufficient insertion into the vacuum chamber of an energetic-beam instrument, as described below.

Further, in this disclosure, the term "light" should be understood to refer to electromagnetic radiation in general, although the wavelengths employed may or may not fall within the range of human vision. Unless otherwise specified, the term "light" is used interchangeably with the term "radiation."

The various embodiments described are generally operated inside an energetic-beam instrument. Such instruments are commonly called "focused ion-beam" (FIB) microscopes, but the term "FIB" or "energetic-beam instrument" is used in this disclosure to refer to any vacuum or variable pressure instrument where operations may be accomplished by an energetic beam, such as an ion beam (100), an electron beam (110), a laser beam (120), or some combination thereof.

Figure 1:
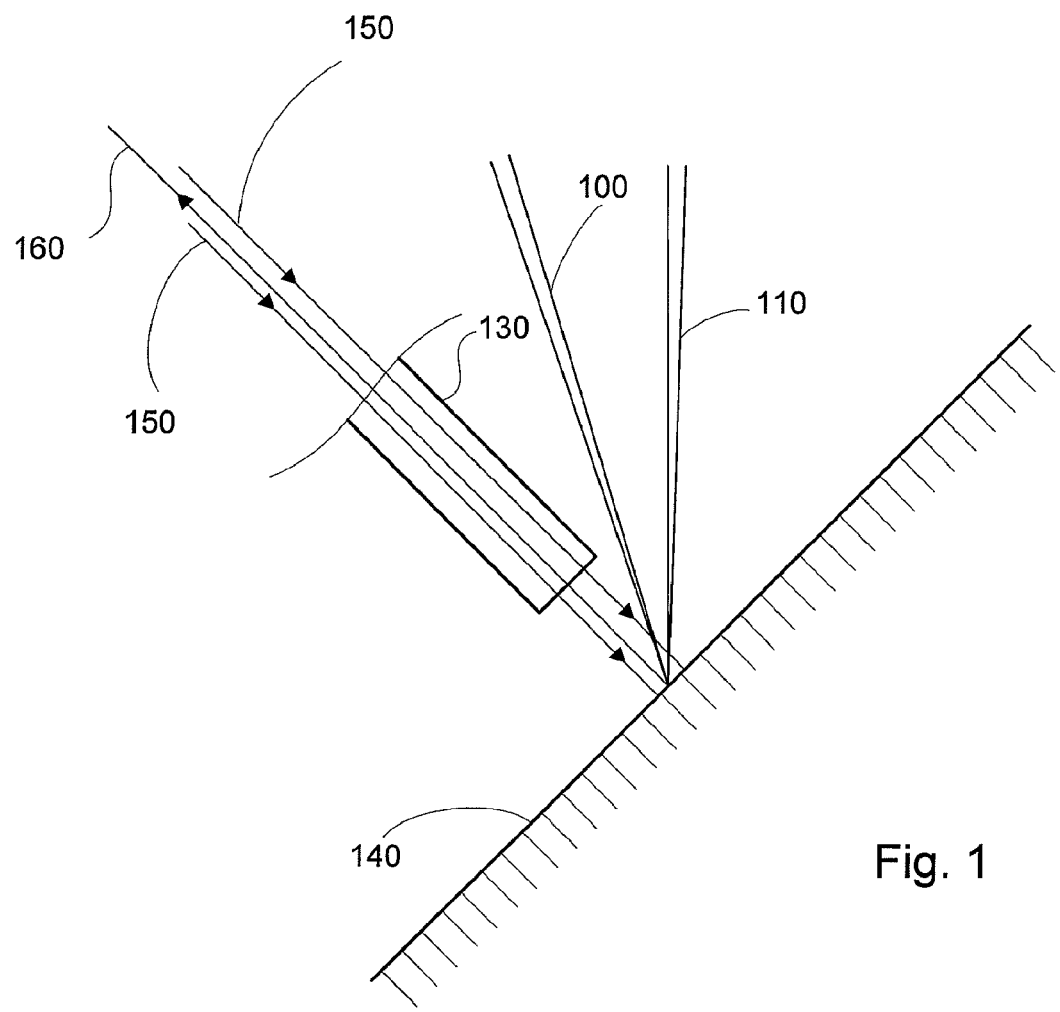
FIG. 1 is a schematic depiction of a single-channel optical processing system operating in the chamber of an energetic-beam instrument.

FIG. 1 schematically shows the SRL (130) of the optical processing system positioned in the chamber of an energetic-beam instrument, near the surface (140) of a sample of interest. An ion beam (100) and electron beam (110) are shown impinging on the region of processing on the sample surface (140). Incident radiation (150) passes through the SRL (130) to the sample surface (140). Radiation reflected (160) from the sample surface (140) enters the SRL (130) and passes through it in the reverse direction. The incident radiation (150) is in general a combination of processing radiation (170) such as laser light, and illumination light (180). The illumination light (180) may be broad-spectrum white light, or also laser light, as discussed in more detail below. Thus, such operations as chemical vapor deposition and etching can be carried out on the sample surface (140) and viewed while the operation is in progress. Further, reflected light from the sample surface (140) may be analyzed by optical spectroscopy. FIG. 1 also shows that not only can processing light (170) and illumination light (180) be directed through the same optical channel, but that the relatively long working distance achieved allows simultaneous use of the FIB ion beam (100) and the electron beam (110) without interference. (In this figure and the others, the drawings are not to scale.)

First Embodiment

Figure 2:
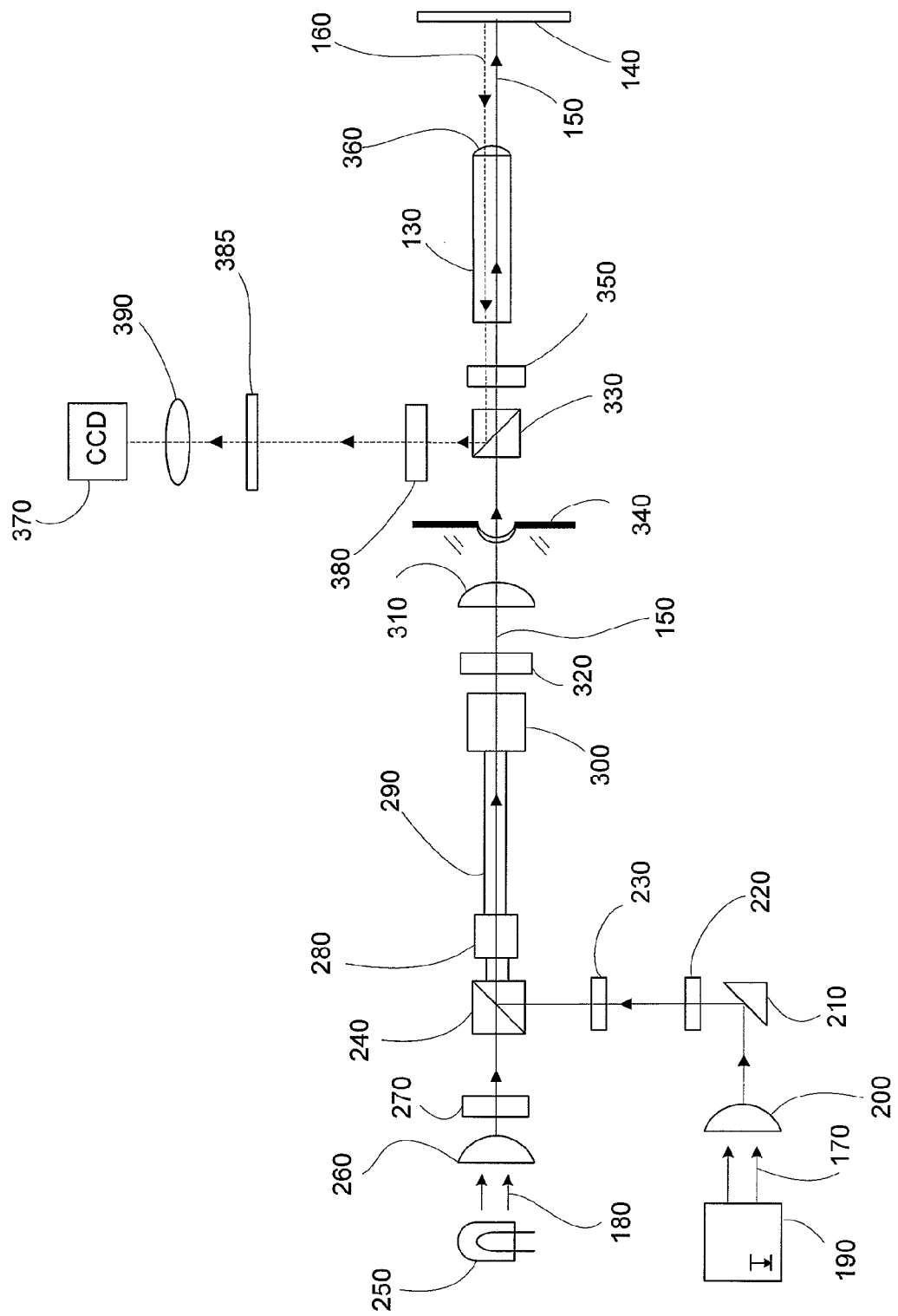
FIG. 2 shows the optical path of the first embodiment of the single-channel optical processing system.

FIG. 2 shows the optical path of a first embodiment of the optical processing system. Beginning from the left, there is a processing light source (190), which generally will be laser light of the appropriate wavelength and power to accomplish the operations desired on the sample surface (140). A beam-shaping lens (200) focuses the light onto a steering reflector (210). The reflector (210) may not be necessary to change the optical path, depending on the physical layout of the apparatus. The laser light (170) passes through a first polarizer (220) and is polarized in a first direction and then through an optional half-wave plate (230). The optional half-wave plate (230) can be rotated to reverse the polarization of the laser light (170) and thus variably reduce its transmission through a combiner (240). The combiner (240) is a beam splitter functioning here as a combiner.

Illumination light (180) from an illumination light source (250), such as a white-light lamp, passes through a first collimating lens (260) and a second polarizer (270) before entering the combiner (240) to travel with the processing radiation (170) in the same optical path. The polarization of the second polarizer (270) is orthogonal to that of the first polarizer (220), to maximize the transmission of the illumination light (180) through the combiner (240). The angle of the faces of the prisms of the combiner (240) is oriented at the Brewster's angle for a pre-determined wavelength, so that the polarized processing radiation (170) will be reflected 90 degrees, and the polarized illumination light (180) will pass straight through the combiner (240), both with very little loss. Suitable polarizing and non-polarizing beam splitters are the models BS010 and PBS3, respectively, manufactured by Thorlabs, Inc. of Newton, N.J.

The combined incident radiation (150) enters a standard fiber coupler (280) to an optical fiber (290) or bundle of such fibers. The optical fiber (290) may be of any length convenient for the physical layout of the light sources (250, 190), the other optical components of the optical processing system, and the energetic-beam instrument (not shown in the whole). A first condenser lens (300) focuses the combined incident radiation (150) emerging from the opposite end of the optical fiber (290). A sapphire ball lens or aspheric lens is preferable, but satisfactory results will usually be obtained with a simple lens. The beam is collimated by a second collimating lens (310). The second collimating lens (310) may if desired be mounted in an X-Y positioner (not shown) to aid in centering the beam of combined incident radiation (150) with the central optical axis of the SRL (130).

A third polarizer (320) is inserted in the optical path at the exit of the optical fiber (290) to polarize the light exiting from the optical fiber (290), because the optical fiber (290) does not support the polarization state of the light entering it. The third polarizer (320) is oriented so that the combined incident radiation (150) will be transmitted through a second beam splitter (330).

Figure 3:
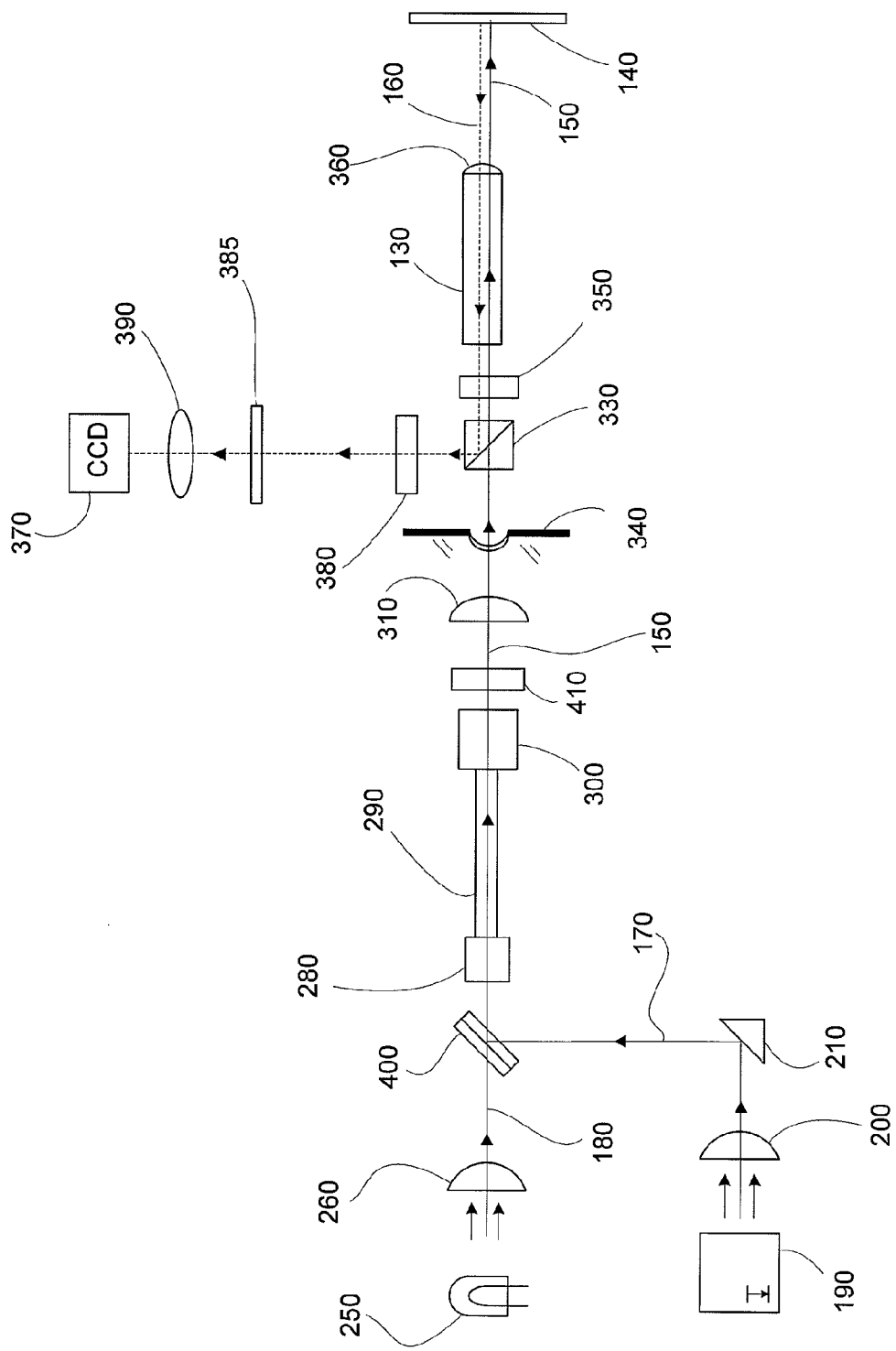
FIG. 3 shows the optical path of another embodiment of the single-channel optical processing system.

Although not essential, it is desirable at this point to pass the collimated combined incident radiation (150) through an aperture (340), as shown in FIG. 3, to reduce the spot size on the sample (140). A lens system with a larger numerical aperture could be used to accomplish this, but would decrease the working distance achieved by use of the SRL (130).

The combined polarized radiation (150) then passes through a quarter-wave retarder plate (350). The combined incident light (150), now linearly polarized, exits the quarter-wave retarder (350) with circular polarization. The combined light (150) enters the SRL (130), passes through an objective lens (360) that is placed adjacent to one end of the SRL (130), preferably at its vacuum end, and thence onto the sample surface (140). To prevent out-gassing from adhesives that could be used to connect the objective lens (360) to the SRL (130), the objective lens (360) should be mechanically held adjacent to the SRL (130). A suitable means would be a metal tube (not shown) having an inside diameter about equal to that of the diameter of the SRL (130), with a smaller-diameter stop at one end thereof to retain the objective lens (360) adjacent to the SRL (130). It is advantageous to place the aperture (340), if used, in the focal plane of the objective lens (360), so that an image of the shape of the aperture (340) will be projected onto the sample surface (140). This would allow the sample surface (140) to be exposed with shapes other than a simple spot.

At least a portion of the combined reflected light (160) from the sample surface (140), including both processing light (170) and illumination light (180), will enter the SRL (130) and pass back through the SRL (130) and the lens (360) at the opposite end thereof. The components of the combined reflected light (160) reflected from the sample surface (140) will be substantially circularly polarized orthogonal to the incident combined light (150); that is, at 90 degrees thereto. Because of the change in polarization of the combined reflected light (160) from the sample surface (140), the combined reflected light (160) will now be reflected by the beam splitter (330) at an angle to its original path (generally by 90 degrees) along a path to an optical detector (370). The optical detector (370) may be a camera having a charge-coupled device (CCD) detector. Other optical detectors (370) could be used, such as a spectroscope with a camera, or a spectrometer.

Before entering the camera (370), however, the combined reflected light (160) preferably passes through a fourth polarizer (380). The fourth polarizer (380) will substantially reduce scattered light coming from the sample surface (140), thus improving contrast. A camera field lens (390), if required by the camera design, focuses the illumination light (180) on the image plane of the camera (370). The component of the reflected light (160) that is processing light (170) will generally not be intense enough to damage the CCD of the camera (370), and it is useful for an operator to see both the general area of the sample surface (140) and the location of focal point of the processing light (170). FIG. 2 shows an optional narrow-band filter (385) that may be inserted in the optical path to the camera (370) either before or after the camera field lens (390), if necessary to reduce the intensity of processing light (170) arriving at the camera (370).

The use of the SRL (130), the combination of processing light (170) and illumination light (180) in a single optical channel (and the selective filtering of the processing light (170) from the illumination light (180), if desired) permits simultaneous viewing and processing while allowing the end of the SRL (130) to be placed at a working distance from the sample surface (140) that does not interfere with the ion beam (100) or the electron beam (110).

Second Embodiment

In another embodiment, the processing light source (190) may be switched off, or the system may be assembled without the processing light source (190) and the components in the optical path of the processing light (170) up to and including the combiner (240). In this embodiment, a sample (140) is illuminated for inspection without processing, while retaining the advantage of the long working distance of the system. The retention of at least two polarizers in the optical path is desirable in order to improve contrast under certain conditions, but their presence is not necessary to obtain the advantage of the long working distance.

Third Embodiment

FIG. 3 is another embodiment of the optical processing system shown in FIG. 2. In this embodiment, the first polarizer (220), the half-wave retarder plate (230) and the combiner (240) are replaced by a dichroic mirror (400). The dichroic mirror (400) has the property of significantly different reflection and transmission properties at two different wavelengths, which is advantageous when two different beams of light with different wavelengths need to be combined or separated. In this embodiment, therefore, separate wavelengths for the processing light (170) and the illumination light (180) will be emitted from the dichroic mirror (400).

The cut-off of a dichroic mirror has a distinct slope and the reflection region is limited. As a general guide, the two wavelengths to be separated should be at least 100 nm apart and the reflection region should not extend more than 300 nm. As known in the art, the best laser wavelength separations include 532/1064 nm, 920/1085 nm, and 1068/1534 nm. Therefore, in this embodiment, the pass-band of the dichroic mirror (400) is selected to pass the wavelength of illumination light (180) desired.

Another different feature in this third embodiment, compared to the embodiment shown in FIG. 2, is the substitution of the third polarizer (320) with a Glan-laser polarizer (410). A Glan-laser polarizer is a birefringent prism consisting of two right-angled calcite prisms that are cemented together by their long faces. The advantage of a Glan-laser polarizer in the present optical system is its excellent extinction ratio performance and broad spectral range. These polarizers are especially beneficial for low-power laser applications, such as those in this disclosure, because the Glan-laser polarizer does not absorb the laser light and thus is not heated. Further, the Glan-laser polarizer (410) enhances the performance of the system because its transmittance is significantly higher than of the regular polarizer. Such polarizers are available from Thorlabs, Inc. of Newton, N.J.

In other respects, the optical path of the embodiment shown in FIG. 3 is the same as that previously described in the first embodiment.

Fourth Embodiment

Figure 4:
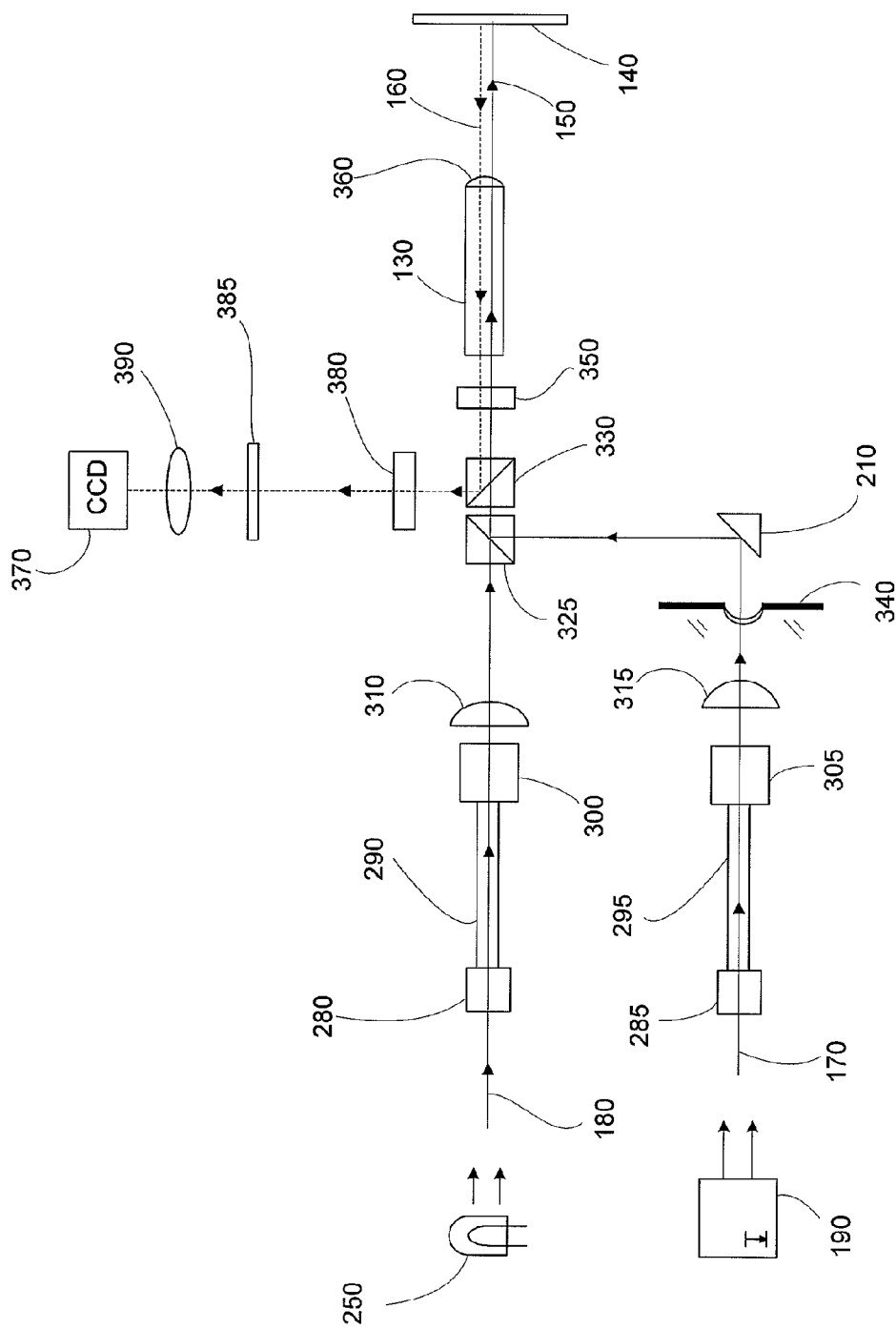
FIG. 4 shows the optical path of a further embodiment of the single-channel optical processing system.

FIG. 4 shows a fourth embodiment, where the source of processing light (170) is directed to a second fiber coupler (285), through a second optical fiber (295), a second condenser lens (305) and second collimating lens (315) (i.e., "second" in this embodiment), before passing through the aperture (340) and (if required by the physical layout) to the reflector (210). In this embodiment, the first polarization of the processing light (170) takes place in a polarizing beam splitter (325). Illumination light (180) is also first polarized at the polarizing beam splitter (325). The rest of the optical path operates as described above for other embodiments, except that the fourth polarizer (380) before the camera (370) is now not required to accomplish the same result.

Fifth Through Seventh Embodiments

Figure 5:
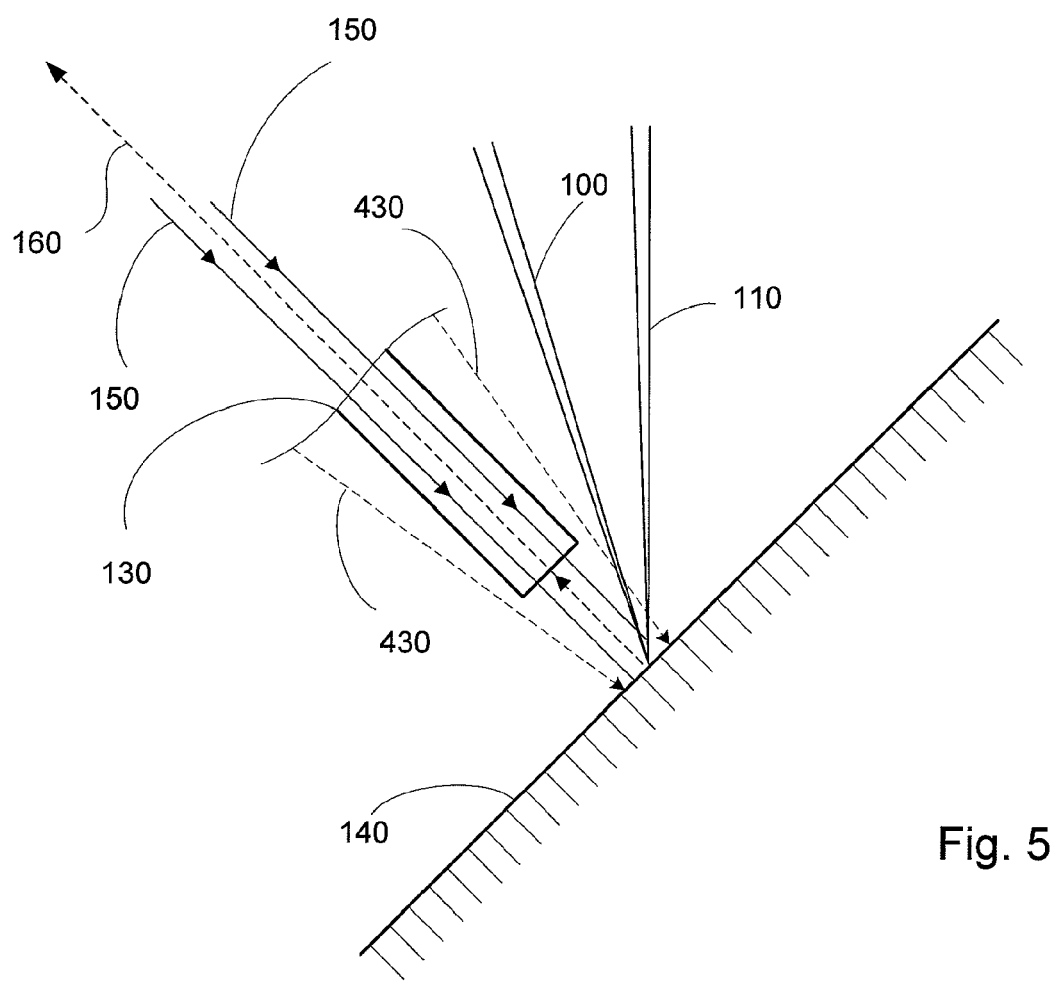
FIG. 5 is a schematic depiction of a single-channel optical processing system operating in the chamber of an energetic-beam instrument with additional off-axis illumination.

The fifth, sixth and seventh embodiments supply an additional source of illumination to the embodiments described above and illustrated in FIGS. 2, 3 and 4, respectively. FIG. 5 schematically shows an embodiment of the optical processing system with optional illumination (430) arranged to illuminate the sample surface (140) at an angle to the central axis of the SRL (130). This off-axis illumination (430) can be delivered, for example, by several lamps (420), built into the instrument (440) used to insert the SRL (130) element of the optical processing system through the wall (450) of the energetic-beam instrument and into its vacuum chamber. The additional off-axis illumination (430) delivered at an angle to the main illumination (180) focused by the SRL (130), can enhance the contrast and resolution of the resulting image.

Figure 6:
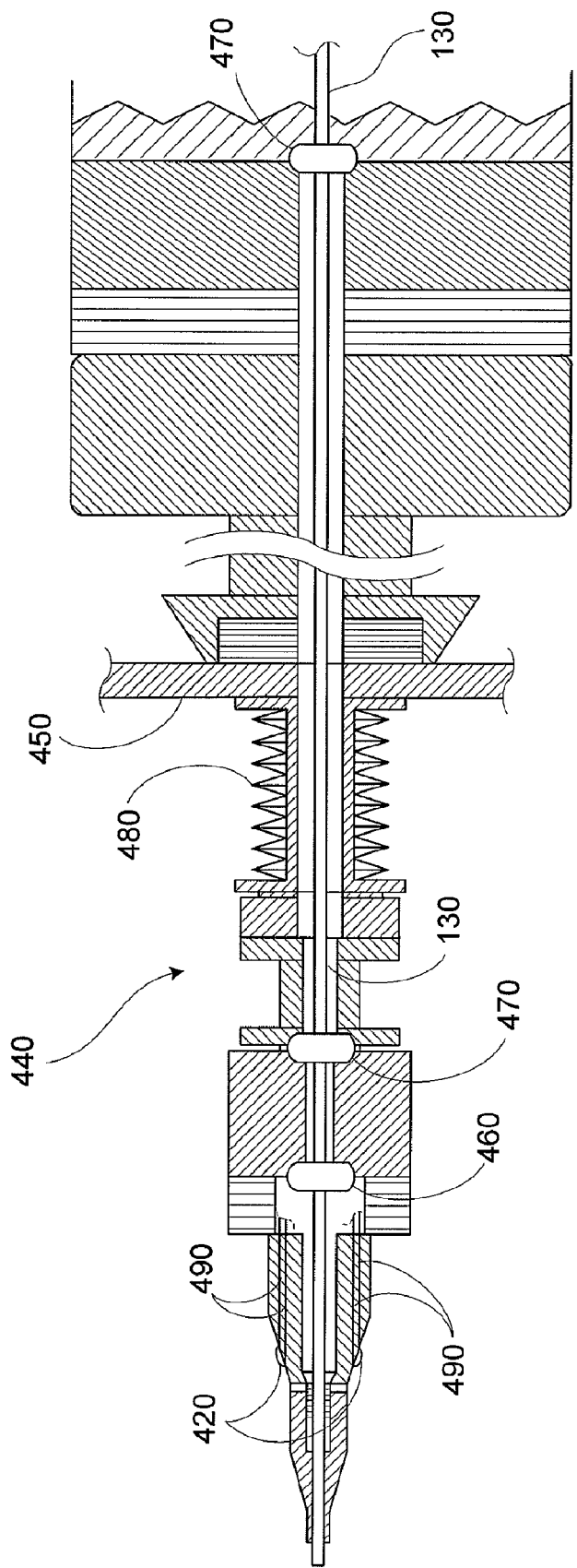
FIG. 6 is a cross-sectional view of an instrument for introducing the self-focusing rod lens of the single-channel optical processing system into the chamber of an energetic-beam instrument.

FIG. 6 is a cross-section of an exemplary mechanical instrument (440) for inserting the SRL (130) element of the optical processing system through the wall (450) of an energetic-beam instrument and into its vacuum chamber. Energetic-beam instruments have ports for the attachment of such instruments. The ports typically allow entry at approximately at 45-degree angle to the horizontal plane. An O-ring (460) seals the vacuum chamber, and a set of second O-rings (470) acts as a vibration damper. A bellows (480) allows for movement of the SRL (130) along its axis. The general mechanical construction of such instruments (often referred to generally as "probes") is known in the art. To provide off-axis illumination (430), the instrument (440) has lamps (420), preferably LED's, arranged to illuminate the sample surface (140). The LED's (420) are powered by electrical circuits (490) exiting through the instrument (440), as may be convenient for its particular construction.

Figure 7:
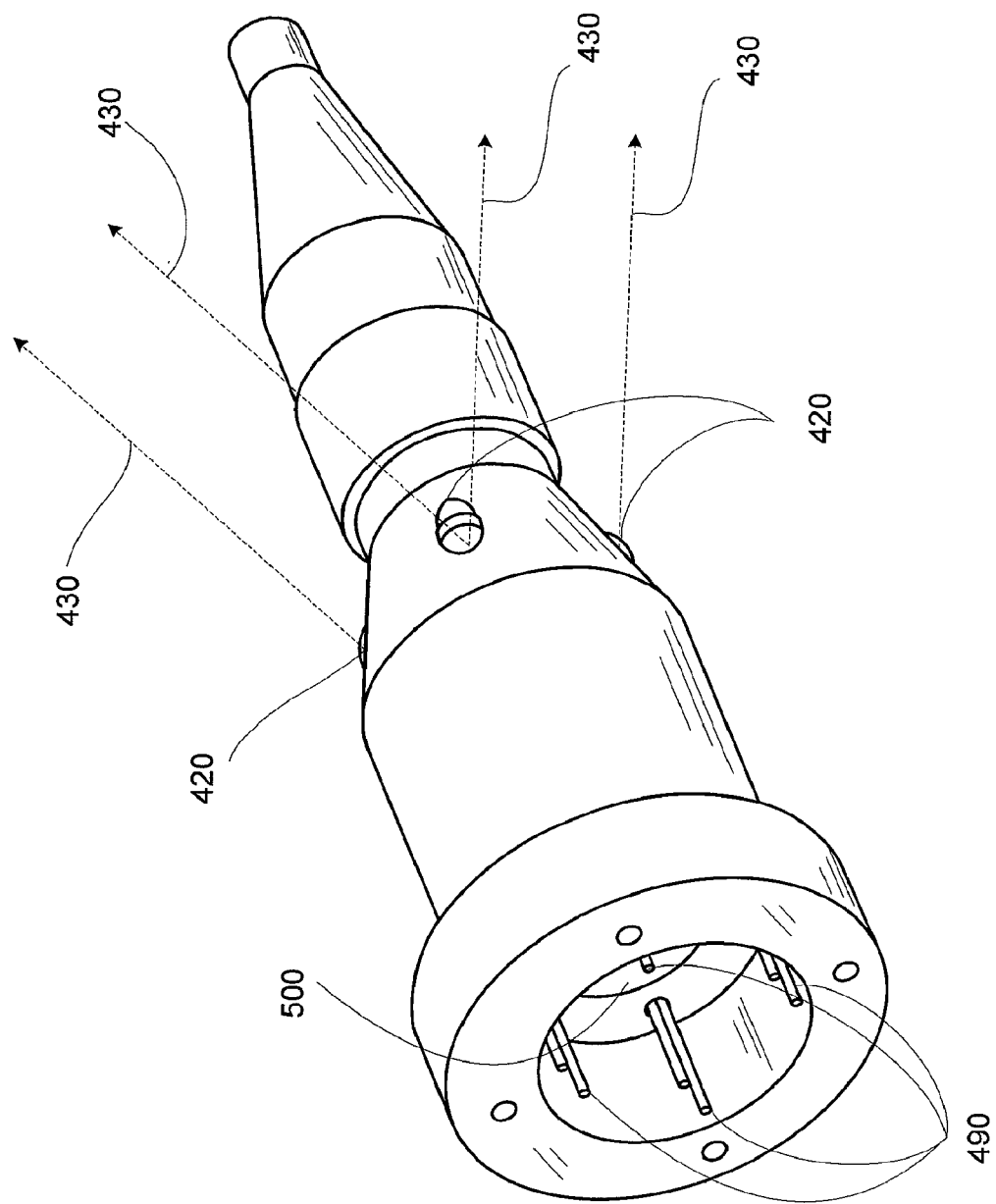
FIG. 7 shows a part of the instrument depicted in FIG. 6 for supporting light sources.

FIG. 7 is a perspective view of a part of the exemplary instrument (440) just described. Off-axis illumination (430) is provided by the lamps (420) arranged in the body of the instrument (440) to illuminate the sample surface. The opening (500) for the SRL (130) is also shown.

Figure 8:
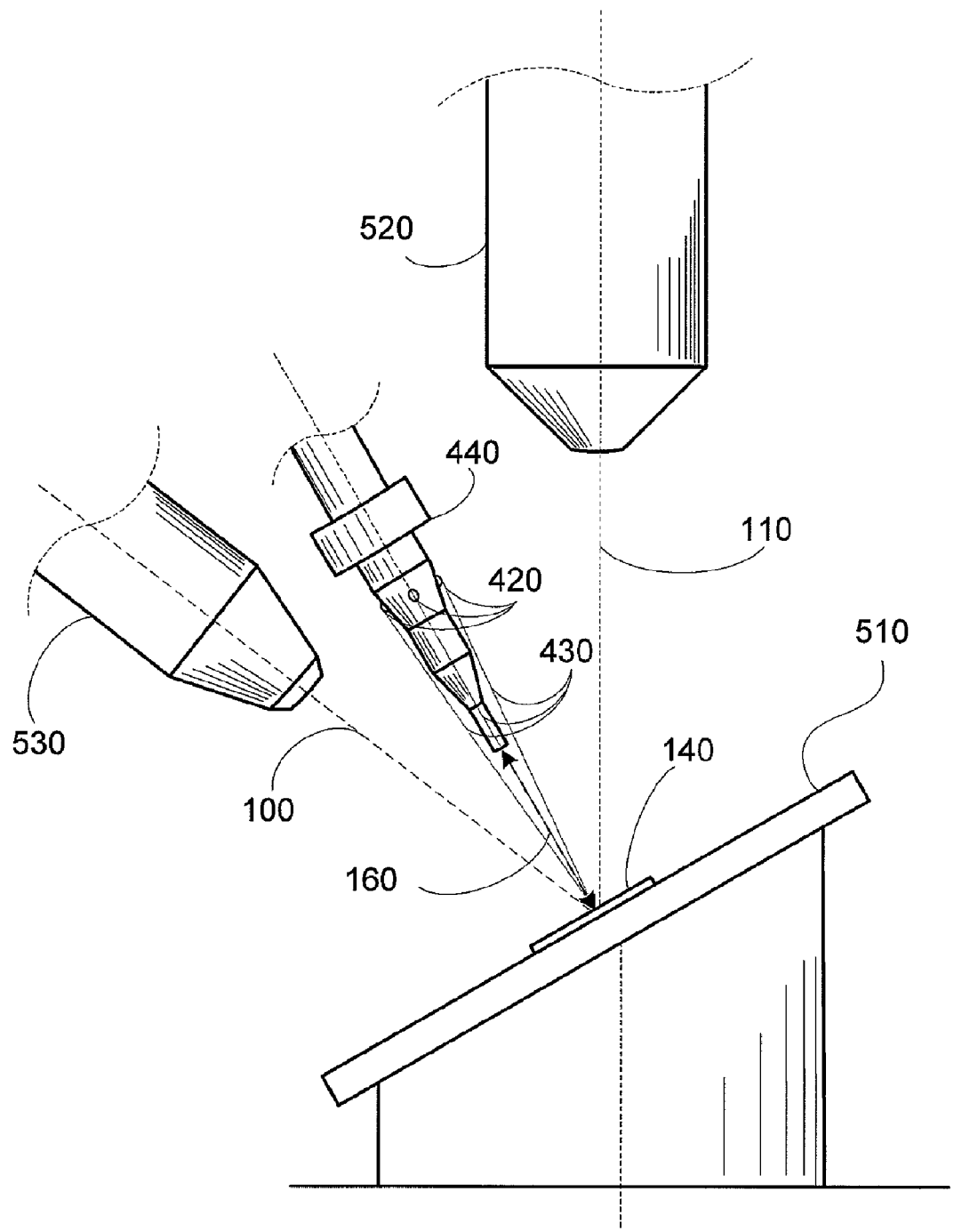
FIG. 8 is a perspective view of an embodiment of the single-channel optical processing system as located inside the chamber of an energetic-beam instrument.

FIG. 8 is a perspective view of the optical processing system working inside an energetic-beam instrument, showing the relative location of a stage (510) for holding a sample whose surface (140) is under inspection. A typical orientation of the electron beam column (520) and the ion beam column (530) is shown. Most energetic-beam instruments allow the movement of the sample stage (510) in X-Y-Z coordinates and also allow the stage to be tilted, as depicted in FIG. 8. FIG. 8 illustrates generally how the optical processing system allows combined processing light (170) and illumination light (180) to be provided in confined space typical of energetic-beam instruments without physically interfering with the electron beam column (520) or the ion beam column (530), whether direct illumination through the SRL (130) or off-axis illumination (430), or both, are used.

We claim:

1. A single-channel optical processing system for an energetic-beam instrument; the system comprising:
   a first optical path for processing radiation;
   a second optical path for illumination radiation;
   a combiner; the combiner oriented so that
      the first optical path and the second optical path are incident on the combiner; and,
      the illumination radiation and the processing radiation pass through the combiner and exit the combiner along a same optical path as combined incident radiation;
   a polarizer positioned in the optical path of the combined incident radiation;
   a beam splitter positioned in the optical path of the combined incident radiation following the polarizer;
      the beam splitter oriented so that the combined incident radiation passes directly through it;

a quarter-wave plate located in the optical path of the combined incident radiation, following the beam splitter;

a self-focusing rod lens, the rod lens having first and second ends;

the self-focusing rod lens located in the optical path of the combined incident radiation following the quarter-wave plate, so that the combined incident radiation enters the first end of the self-focusing rod lens and exits from the second end thereof;

the second end of the self-focusing rod lens located in the vacuum chamber of the energetic-beam instrument, so as to allow a sample surface located in the vacuum chamber of the energetic-beam instrument to be illuminated by the combined incident radiation;

the self-focusing rod lens further located to receive at the second end thereof at least a portion of the combined incident radiation reflected from the sample surface;

the self-focusing rod lens further located so that the portion of the reflected combined radiation received by the self-focusing rod lens exits from the first end of the self-focusing rod lens, passes through the quarter-wave plate and enters the beam splitter; and, the beam splitter further oriented so as to reflect the reflected combined radiation at an angle from the optical path of the reflected combined radiation exiting the self-focusing rod lens.

2. The single-channel optical processing system of claim 1, further comprising:

an optical detector located in the optical path of the reflected combined radiation exiting from the beam splitter.

3. The single-channel optical processing system of claim 2, where the optical detector is a camera.

4. The single-channel optical processing system of claim 2, where the optical detector is a spectrometer.

5. The single-channel optical processing system of claim 1, further comprising a half-wave plate located in the first optical path before the combiner, for variably reducing the transmission of the processing radiation through the combiner.

6. The single-channel optical processing system of claim 1, further comprising an aperture;

the aperture located in the optical path of the combined incident radiation before the beam splitter.

7. The single-channel optical processing system of claim 1, further comprising an objective lens;

the objective lens located adjacent to the second end of the self-focusing rod lens.

8. The single-channel optical processing system of claim 1, further comprising:

a second polarizer;

the second polarizer located in the optical path of the reflected combined radiation between the beam splitter and the optical detector.

9. The single-channel optical processing system of claim 8, where the second polarizer is a Glan-laser polarizer.

10. The single-channel optical processing system of claim 1, further comprising:

a narrow-band filter;

the narrow-band filter located in the optical path of the reflected combined radiation and the optical detector.

11. The single-channel optical processing system of claim 1, where the combiner is a dichroic mirror.

12. The single-channel optical processing system of claim 1, further comprising:

the self-focusing rod lens having a central axis;

a source of illumination radiation located inside the energetic-beam instrument so as to provide illumination to the sample surface at an angle off the central axis of the self-focusing rod lens.

13. A single-channel optical processing system for an energetic-beam instrument; the system comprising:

an optical path for illumination radiation;

a polarizer positioned in the optical path for illumination radiation;

a beam splitter positioned in the optical path for illumination radiation following the polarizer;

the beam splitter oriented so that illumination radiation passes directly through it on the same optical path;

a quarter-wave plate located in the optical path for illumination radiation, following the beam splitter;

a self-focusing rod lens, the rod lens having first and second ends;

the self-focusing rod lens located in the optical path for illumination radiation following the quarter-wave plate, so that the illumination radiation enters the first end of the self-focusing rod lens and exits from the second end thereof;

the second end of the self-focusing rod lens located in the vacuum chamber of the energetic-beam instrument, so as to allow a sample surface located in the vacuum chamber of the energetic-beam instrument to be illuminated by the illumination radiation;

the self-focusing rod lens further located to receive at the second end thereof at least a portion of the illumination radiation reflected from the sample surface;

the self-focusing rod lens further located so that the portion of the reflected illumination radiation received by the self-focusing rod lens exits from the first end of the self-focusing rod lens, passes through the quarter-wave plate and enters the beam splitter; and, the beam splitter further oriented so as to reflect the reflected illumination radiation at an angle from the optical path of the reflected illumination radiation exiting the self-focusing rod lens.

14. The single-channel optical processing system of claim 13, further comprising:

an optical detector located in the optical path of the reflected illumination radiation exiting from the beam splitter.

15. The single-channel optical processing system of claim 14, where the optical detector is a camera.

16. The single-channel optical processing system of claim 14, where the optical detector is a spectrometer.

17. The single-channel optical processing system of claim 13, further comprising an aperture;

the aperture located in the optical path for illumination radiation before the beam splitter.

18. The single-channel optical processing system of claim 13, further comprising an objective lens;

the objective lens located adjacent to the second end of the self-focusing rod lens.

19. The single-channel optical processing system of claim 13, further comprising:

a second polarizer;

the second polarizer located in the optical path of the reflected illumination radiation between the beam splitter and the optical detector.

20. The single-channel optical processing system of claim 13, further comprising:
the self-focusing rod lens having a central axis;
a source of illumination radiation located inside the energetic-beam instrument so as to provide illumination to the sample surface at an angle off the central axis of the self-focusing rod lens.

21. A single-channel optical processing system for an energetic-beam instrument; the system comprising:
a first optical path for processing radiation;
a second optical path for illumination radiation;
a dichroic mirror; the dichroic mirror oriented so that
the illumination radiation and the processing radiation pass through the dichroic mirror and exit the dichroic mirror along the same optical path as combined incident radiation;
a polarizer positioned in the optical path of the combined incident radiation;
a beam splitter positioned in the optical path of the combined incident radiation following the polarizer;
the beam splitter oriented so that the combined incident radiation passes directly through it;
a quarter-wave plate located in the optical path of the combined incident radiation, following the beam splitter;
a self-focusing rod lens, the rod lens having first and second ends;
the self-focusing rod lens located in the optical path of the combined incident radiation following the quarter-wave plate,
so that the combined incident radiation enters the first end of the self-focusing rod lens and exits from the second end thereof;
the second end of the self-focusing rod lens located in the vacuum chamber of the energetic-beam instrument,
so as to allow a sample surface located in the vacuum chamber of the energetic-beam instrument to be illuminated by the combined incident radiation;
the self-focusing rod lens further located to receive at the second end thereof at least a portion of the combined incident radiation reflected from the sample surface;
the self-focusing rod lens further located so that
the portion of the reflected combined radiation received by the self-focusing rod lens exits from the first end of the self-focusing rod lens, passes through the quarter-wave plate and enters the beam splitter; and,
the beam splitter further oriented so as to reflect the reflected combined radiation at an angle from the optical path of the reflected combined radiation exiting the self-focusing rod lens.

22. The single-channel optical processing system of claim 21, further comprising:
an optical detector located in the optical path of the reflected combined radiation exiting from the beam splitter.

23. The single-channel optical processing system of claim 22, where the optical detector is a camera.

24. The single-channel optical processing system of claim 22, where the optical detector is a spectrometer.

25. The single-channel optical processing system of claim 21, further comprising an aperture;
the aperture located in the optical path of the combined incident radiation before the beam splitter.

26. The single-channel optical processing system of claim 21, further comprising an objective lens;
the objective lens located adjacent to the second end of the self-focusing rod lens.

27. The single-channel optical processing system of claim 21, where the polarizer is a Glan-laser polarizer.

28. The single-channel optical processing system of claim 21, further comprising:
a second polarizer;
the second polarizer located in the optical path of the reflected combined incident radiation between the beam splitter and the optical detector.

29. The single-channel optical processing system of claim 21, further comprising:
a narrow-band filter;
the narrow-band filter located in the optical path of the reflected combined radiation and the optical detector.

30. The single-channel optical processing system of claim 21, further comprising:
the self-focusing rod lens having a central axis;
a source of illumination radiation located inside the energetic-beam instrument so as to provide illumination to the sample surface at an angle off the central axis of the self-focusing rod lens.

31. A single-channel optical processing system for an energetic-beam instrument; the system comprising:
a first optical path for processing radiation;
the first optical path comprising a first optical fiber;
a second optical path for illumination radiation;
the second optical path comprising a second optical fiber;
a combiner;
the first optical fiber located so that processing radiation exiting therefrom enters a first face of the combiner;
the second optical fiber located so that processing radiation exiting therefrom enters a second face of the combiner;
the combiner oriented so that
the illumination radiation and the processing radiation pass through the combiner and exit the combiner along a same optical path as combined incident radiation;
a polarizer positioned in the optical path of the combined incident radiation;
a beam splitter positioned in the optical path of the combined incident radiation following the polarizer;
the beam splitter oriented so that the combined incident radiation passes directly through it;
a quarter-wave plate located in the optical path of the combined incident radiation, following the beam splitter;
a self-focusing rod lens, the rod lens having first and second ends;
the self-focusing rod lens located in the optical path of the combined incident radiation following the quarter-wave plate,
so that the combined incident radiation enters the first end of the self-focusing rod lens and exits from the second end thereof;
the second end of the self-focusing rod lens located in the vacuum chamber of the energetic-beam instrument,
so as to allow a sample surface located in the vacuum chamber of the energetic-beam instrument to be illuminated by the combined incident radiation;
the self-focusing rod lens further located to receive at the second end thereof at least a portion of the combined incident radiation reflected from the sample surface;
the self-focusing rod lens further located so that the portion of the reflected combined radiation received by the self-focusing rod lens exits from the first end of the self-focusing rod lens, passes through the quarter-wave plate and enters the beam splitter; and, the beam splitter further oriented so as to reflect the reflected combined radiation at an angle from the optical path of the reflected combined radiation exiting the self-focusing rod lens.

32. The single-channel optical processing system of claim 31, further comprising:
an optical detector located in the optical path of the reflected combined radiation exiting from the beam splitter.

33. The single-channel optical processing system of claim 32, where the optical detector is a camera.

34. The single-channel optical processing system of claim 32, where the optical detector is a spectrometer.

35. The single-channel optical processing system of claim 31, further comprising an aperture;
the aperture located in the optical path of the combined incident radiation before the beam splitter.

36. The single-channel optical processing system of claim 31, further comprising an objective lens;
the objective lens located adjacent to the second end of the self-focusing rod lens.

37. The single-channel optical processing system of claim 31, further comprising:
a second polarizer;
the second polarizer located in the optical path of the reflected combined radiation between the beam splitter and the optical detector.

38. The single-channel optical processing system of claim 31, further comprising:
a narrow-band filter;
the narrow-band filter located in the optical path of the reflected combined radiation and the optical detector.

39. The single-channel optical processing system of claim 31, where the combiner is a dichroic mirror.

40. The single-channel optical processing system of claim 31, further comprising:
the self-focusing rod lens having a central axis;
a source of illumination located inside the energetic-beam instrument so as to provide illumination to the sample surface at an angle off the axis of the self-focusing rod lens.

* * * * *